United States Patent [19]

Szedon

[11] 4,326,165
[45] Apr. 20, 1982

[54] CORONA CHARGING FOR TESTING RELIABILITY OF INSULATOR-COVERED SEMICONDUCTOR DEVICES

[75] Inventor: John R. Szedon, McKeesport, Pa.

[73] Assignee: Westinghouse Electric Corp., Pittsburgh, Pa.

[21] Appl. No.: 110,980

[22] Filed: Jan. 10, 1980

[51] Int. Cl.³ ............................................. G01R 31/26
[52] U.S. Cl. ............................ 324/158 R; 324/158 D
[58] Field of Search ........... 324/158 R, 158 D, 158 T, 324/60 R, 60 C

[56] References Cited

U.S. PATENT DOCUMENTS 4,220,918 9/1980 Pepper ............................ 324/158 D

OTHER PUBLICATIONS

Woods et al; "Injection and Removal . . . "; J. Appl. Phys.; vol. 44; No. 12; Dec. 1973; pp. 5506–5510.

Williams et al; "Mobile Fluoride Ions in $SiO_2$"; J. Appl. Phys.; vol. 46; No. 2; Feb. 1975; pp. 695–698.

Weinberg, Z. A.; "Hole Injection . . . "; Appl. Phys. Letters; vol. 27; No. 8; Oct. 15, 1975; pp. 437–439.

Grove; "Physics and Technology of Semiconductor Devices"; John Wiley & Sons, New York, N.Y.; 1967; pp. 303–304.

Wu et al; "Charge Phenomena . . . "; J. Appl. Phys.; vol. 39; No. 12; Nov. 1968; pp. 5613–5618.

Primary Examiner—Ernest F. Karlsen
Attorney, Agent, or Firm—C. L. Menzemer

[57] ABSTRACT

A method for predicting certain electrical failures in a semiconductor device after long-term operation, includes the steps of measuring a predetermined parameter of the semiconductor device before and after it is exposed to a corona discharge and then comparing the two measurements.

2 Claims, 1 Drawing Figure

U.S. Patent    Apr. 20, 1982    4,326,165
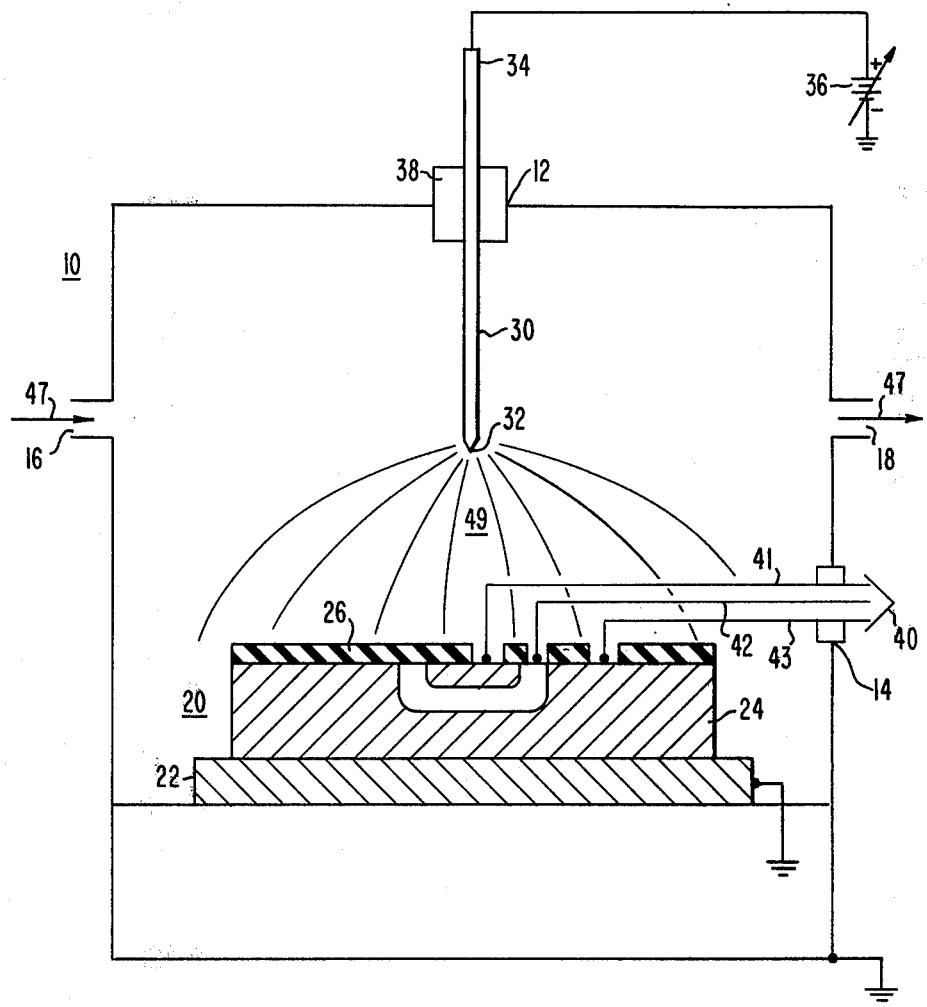

CORONA CHARGING FOR TESTING RELIABILITY OF INSULATOR-COVERED SEMICONDUCTOR DEVICES

BACKGROUND OF THE INVENTION

1. Field of the Invention

The present invention relates to the determining of electrical parameters of semiconductor devices, and in particular to a method for determining electrical parameters of semiconductor devices by exposing them to a corona discharge.

2. Description of the Prior Art

A large portion of long-term electrical failures of semiconductor devices and integrated circuits is due to surface electrical mechanisms. These surface mechanisms include contaminant sodium ion migration, moisture enhanced surface conductivity of passivating layers, and electrical instability at elevated temperatures of plastic coating or encapsulating materials. Elimination of these mechanisms, while possible, is not assured in any given device or circuit.

The manner in which these surface electrical mechanisms affect devices is by electrical field effect action on the underlying semiconductor surfaces. In simple cases, it is possible to minimize effects of surface electrical sensitivity, for example, by using diffused guard rings or "channel stops" to break shunting channel paths on device surfaces or by placing metal field plates over junction edges to act as electrostatic shields. In more complex units, such design approaches may be too wasteful of space or may introduce undesirable parasitic capacitances. As a result, the inherent surface electrical sensitivity of devices or circuits can be widely variable. There are corresponding variations and propensity to device or circuit failure even for identical conditions of surface failure mechanisms. Even in the case of simple transistors, devices from one supplier may exhibit significant degradation in important electrical parameters, such as the common emitter current gain as a result of electrical stress at high temperatures in the presence of surface contaminants, while those from another supplier may be quite stable.

Clearly, a method of assessing the surface sensitivity of semiconductor devices and circuits has useful application. For the user, it could allow selection of the least surface sensitive units when several sources are available. For a manufacturer, it might allow segregating units of a given type according to degree of sensitivity. Less sensitive units could be marketed for applications demanding more reliability.

To date, only indirect methods have been used to assess surface electrical sensitivity of complex semiconductor products, generally without separating failure due to electrical surface sensitivity from failure due to surface electrical mechanisms. Usually, semiconductor devices are subjected in sufficient numbers to stress testing, for example, electrical bias at elevated temperature or humidity, for prolonged periods of time, for example, 100 hours to 1000 hours. Failures to perform within specified limits are analyzed statistically.

The tests may be used to screen out unacceptable units or to qualify an entire lot from which the test sample was selected. Results for tests of longer duration may be used to estimate failure rates for the units in use. Such approaches can be costly and time consuming. Since they do not separate surface sensitivity from failure of mechanisms such as ion or moisture contamination, the results are only valid for the conditions of a given test population. Such results are often misapplied when low failure rates are indicated, as being characteristic of particular vendors or fabrication technologies.

Since surface electrical failure in use occurs through field effect means, it is desirable to have a method using these means to characterize the surface electrical sensitivity of completed semiconductor products of any given type, before final encapsulation. It is desirable that this can be done without using special test structures on the product and without altering the design or fabrication of the product in order to minimize the particular costs associated with the method.

Corona charging of uniform insulator surfaces on uniformly-doped semiconductor pieces has been used as a tool to study ion migration and electronic conduction in insulator films. In particular, a corona charging method is discussed in Woods, et al, "Injection and Removal of Ionic Charge at Room Temperature Through the Interface of Air with $SiO_2$", Journal of Applied Physics, Vol. 44, No. 12, December 1973; Woods et al, "Mobile Fluoride Ions in $SiO_2$", Journal of Applied Physics, Vol. 46, No. 2, February 1975; and Weinberg, "Hole Injection and Transport in $SiO_2$ Films on Si", Applied Physics Letters, Vol. 27, No. 8, 15 October 1975. In the above articles, no device structures were formed in the silicon substrates, consequently, there was no attempt to use corona charging for the purposes of changing the electrical conditions at the semiconductor surfaces.

In addition, it is clear that semiconductor devices which are electrically sensitive to surface effects can be optimized in some aspect of their electrical behavior if the electric field normal to the device surface can be controllably adjusted. Such optimization is of practical significance if permanent electric field adjustment is possible.

With the development of metal-oxide-semiconductor (MOS) technology, it has been possible to use thin film insulated (TFI) metal field plates for controlling the electric field at semiconductor surfaces. Such a method is shown and discussed in Grove, "Physics and Technology of Semiconductor Devices", FIGS. 10.12 and 10.13, pages 303–304, John Wiley & Sons, Inc., New York (1967). Although TFI metal field plates may be used in some special devices, this approach is not widely used in commercial devices for a number of reasons. Among these are: (1) the spaced required for field plates may not be available in densely packed circuits; (2) the finite dimensions of the field plates may produce undesirable electric field enhancement at their edges; (3) the field plates may introduce undesirable parasitic capacitances; (4) for greatest flexibility, an external biasing terminal is required for each field plate; (5) internally grounded field plates may be used to reduce surface sensitivity but they do not permit optimal surface field control; (6) field plates must be designed into device or circuit structures, their addition to otherwise desirable products could be cumbersome; (7) field plates are not readily prepared on nonplanar, i.e., mesa surfaces; (8) for optically sensitive devices, special technologies are required for either thin metal or conducting oxide field plates.

Another approach to controlling surface electric fields is possible, in principle, by adjusting the charge associated with the passivating dielectric layers applied to the device surfaces. For thermally grown $SiO_2$ on silicon, the net insulator charge density, as determined using MIS structures, is a function of processing parameters including moisture content of the oxidizing ambient, the temperature of growth, and the cooling rate, as discussed in the above-referenced Grove text at page 343, FIG. 12.8. This is not a particularly practical approach to controlling surface behavior. In devices requiring complex fabrication, the ability to finely control insulator charge by these means is lost.

Even if processing controls with thermally grown oxides were sufficiently practical, the insulator charge is always positive in sign, thus precluding adjustment of surface fields when negative charge is needed. Other insulator deposition techniques, such as reactive sputtering, can produce films having charge of both polarities as discussed in Wu and Formigoni, "Charge Phenomena in dc Reactively Sputtered $SiO_2$ Films", Journal of Applied Physics, Vol. 39, No. 12, November 1968. Such processes have not been widely applied to silicon device or integrated circuit fabrication, suffering as does thermal oxidation, from the inability to finely control charge effects during complex fabrication steps. A method is needed to adjust the surface electric field in semiconductor devices having insulating films on their surfaces while avoiding the disadvantages detailed above in reference to the TFI field-plate method of surface field control. This method should include the ability to finely control charge effects during complex fabrication steps.

SUMMARY OF THE INVENTION

According to the teachings of the method of the present invention, the insulator covered portions of semiconductor devices or integrated circuits are exposed to a corona discharge for modulating the normal component of the electric field at the surface of the semiconductor devices or integrated circuits being tested. Measurements of certain operating parameters of the devices and circuits being tested are performed before and after the exposure to corona discharge for assessing the surface sensitivity of the semiconductor devices and circuits under test. From the results of the before and after measurements, predictions can be made concerning the reliability of the circuits and devices under test.

Moreover, the method of the present invention further includes, in addition to the steps recited hereinabove, steps for maintaining a corona charge on a surface of the semiconductor devices under test. The additional steps include exposing the semiconductor devices under test to a moisture-free ambient and then causing the depositing of a dielectric substance on the surface of the semiconductor device under test for maintaining the corona charge thereon.

DESCRIPTION OF THE PREFERRED EMBODIMENT

A single FIGURE shows a prior art corona apparatus suitable for use in practicing the method of the present invention. The corona apparatus of FIG. 1 is shown and discussed generally in Woods et al., "Injection and Removal of Ionic Charge at Room Temperature Through the Interface of Air with $SiO_2$", J. Appl. Phys., Vol. 44, No. 12, December 1973. In particular, FIG. 1 shows a grounded enclosure 10 having openings 12, 14, 16 and 18. Inside the enclosure 10, a semiconductor device 20 is attached to a foundation 22 for providing a path for the device 20 to ground. The semiconductor device 20 comprises a semiconductor substrate 24 coupled to the foundation 22 and a layer of insulating material 26 on the substrate 24. The semiconductor substrate 24 may comprise any operative semiconductor configuration including a range of complexity from a simple semiconductor diode to an integrated circuit having a plurality of operative semiconductor devices. Means for producing a corona include a metal conducting rod 30 having a pointed end 32 positioned through the opening 12 in the enclosure 10 about 1 cm above the insulator 26 and having an end 34 coupled to a high voltage DC power supply 36. The power supply 36 generates a voltage of about 10 kV. Means 38 are included for sealing the rod 30 in the opening 12. A set 40 of leads, for example, leads 41, 42 and 43 are attached to the semiconductor device 20 and extend through the opening 14 for allowing the measuring of the desired operating parameters of the device 20. Means 45 are included for sealing the leads 40 in the opening 14. Means are provided including the openings 16 and 18 for providing a dry ambient inside the enclosure 10 which will support a corona discharge. The openings 16 and 18 serve, respectively, as inlet and outlet for a stream or jet of dry air or dry nitrogen as shown by the arrows at 47. Any method or substance may be used as an alternative to dry air or dry nitrogen so long as the semiconductor device 20 is provided a moisture-free environment or, generally, is provided an environment which will support a corona discharge.

In summary of the operation of the preferred embodiment of the present invention, the semiconductor device 20 is exposed first to positive and then to negative corona discharge. Measurements of certain electrical performance parameters, for example, current-voltage (I-V) characteristics, are taken before and after each corona discharge to detect whether there has been a change in any of the performance parameters due to the exposure of the semiconductor device 20 to the corona discharge or, generally, due to the change in the normal component of the electric (E) field at the surface of the semiconductor device 20 caused by the exposure to the corona discharge.

In particular, I-V measurements, for example, are taken while the semiconductor device 20 is in an uncharged state—that is, before any exposure to corona discharge—for developing a standard of performance against which to compare subsequent measurements. The semiconductor device 20 is then exposed to, for example, a positive corona discharge from the rod end 32 after which the same I-V measurements are taken. The positive corona charge is then discharged by any well-known method, for example, by exposing the semiconductor 20 to a moist gas such as nitrogen or air in the absence of corona discharge from the rod 32, while the electrical terminals of the semiconductor device 20 are grounded or, generally, in some other way, increasing the surface conductivity of the insulator 26 in order to discharge it. Next, the semiconductor device 20 is exposed to a negative corona discharge from the rod end 32 after which the same IV measurements are taken which were taken with regard to the positive corona charge. The negative corona charge can then be discharged in the same manner, for example, as described above in reference to the discharging of the positive corona charge. The measurements taken after both the positive and the negative corona charging steps are compared with the standard measurements taken with no charge on the semiconductor device 20 to determine if there is any deviation in the measurements after corona charging from the standard measurements taken while the semiconductor device 20 was in an uncharged state.

In greater detail, in each of the corona charging steps, the period of exposure of the semiconductor device 20 to the corona charge from the rod end 32 is typically on the order of 60 seconds. By way of specific explanation, when a corona charge on the semiconductor device 20 is established by the rod end 32, ionic species move from the vicinity of the metal point 32 along lines of force at 49 to the semiconductor device 20. Certain ionic species landing on the insulator 26 become relatively immobile. They charge the top surface of the insulator 26, increasing the electric field therewithin. As the electric field within the insulator 26 increases, electron (or hole) conduction through the insulator 26 also increases until the current through the insulator 26 is equal to the corona current. No further charging of the top surface of the insulator 26 can occur. The ceasing of corona charging leaves a charge on the top surface of the insulator 26 whose decay with time is controlled by surface and bulk leakage. For a highly-insulating dielectric such as $SiO_2$, for example, in a dry ambient, charge retention can be quite long, on the order of many days, permitting convenient measuring of the desired performance parameters. For example in Wemberg, "Tunneling of Electrons From Si into Thermally Grown $SiO_2$", Solid-State Electronics Vol. 20, No. 1, January 1977, from FIG. 5 a reduction of only 16% in the electric field in a corona-charged insulator is inferred to have occurred in a 27 hr. period.

In some instances, it may be desirable to maintain a corona charge on the insulating layer 26 or at least to suppress the discharging of a corona charge in order to achieve improved electrical performance of the semiconductor device 20 caused by the modulated surface electric fields. According to the teachings of the method of the present invention, a modulated electric field at the surface of the semiconductor device can be maintained, for example, by applying a quantity of Krylon type 1204 to the surface of the insulator layer 26, for example, by spraying for a few (10) seconds. A moisture-free environment surrounding the semiconductor device 20, should be maintained, for example, by directing a jet of dry nitrogen on the semiconductor device 20 at all times except for the few seconds of Krylon spraying. The quantity of Krylon applied to the surface of the insulator layer 26 is allowed to dry for a few minutes.

The current understanding of corona charging effects on insulators holds that holes and electrons are injected into the insulator by, respectively, positively and negatively charged corona ions. In the case of positive ions, this injection results either in a combined resonance neutralization of the ion followed by Auger de-excitation of the neutralizing electron or by direct Auger neutralization as described in Kiess, "The Physics of Electrical Charging and Discharging of Semiconductors", RCA Review, Vol. 36, pp. 667–710 (1975). The holes liberated by these processes must be trapped if insulator charging is to be observed. This trapping can occur within the insulating layer 26 or very near the surface of the insulating layer 26 which surface is exposed to the corona ions. The latter is more probable in the case of insulators.

If the trapped carriers cannot communicate electrically with regions, such as metallic electrical contacts, which can act as carrier sinks or sources (e.g., for oppositely charged carriers), the corona-introduced charge is very slow in decaying. Alternatively, if the carriers are trapped at some depth within the insulator, the moisture-induced conducting surface of the insulating layer 26 might act as an effective electrical contact through which trapped carrier discharge could occur by tunneling or other means.

Application of a highly resistive, moisture-insensitive organic coating such as the Krylon type 1204 to a corona-charged insulator will suppress the discharging of the corona in the insulating layer 26. In the case of carriers trapped at the surface of the insulating layer 26, the applying of the Krylon coating will prevent direct discharging of the corona through a conducting path, since the resistance of the applied Krylon coating is very high during both the period before the coating is cured and the period after the coating is cured. Once cured, the Krylon coating will prevent decay of bulk trapped charge in the original insulator by virtue of the thickness and insulation resistance of the Krylon coating, regardless of moisture-enhanced surface conduction. Of course, if the Krylon coating were to be permeated by moisture and rendered more conducting, eventual discharge of the corona-introduced charge would occur.

Other organic dielectric materials may be considered for the same purpose of protecting the corona-deposited charge. The properties of the material applied to the surface of the insulating layer 26 will include high bulk resistivity and high surface resistivity in both liquid and cured states for preventing a corona charge from dissipating through the resistive medium of the material, preferably reasonably rapid curing period on the order of 1–5 minutes at a temperature, preferably room temperature, which will not affect the corona-deposited charge, and good adhesion to the surface of the insulating layer 26 for protecting the surface thereof from air or moisture. In addition, the material applied to the insulating layer 26 should be characterized by a low loss tangent preferably on the order of 0.0001 or lower for causing minimal perturbation to capacitive elements which may be coated.

What I claim is:

1. A method for predicting certain electrical failures in semiconductor devices after long-term operation, said method comprising the steps of:
   (a) measuring a predetermined parameter of said semiconductor device for determining a standard measure of said predetermined parameter;
   (b) exposing said semiconductor device to first a positive corona discharge and then to a negative corona discharge;
   (c) measuring said predetermined parameter for determining a comparison measure of said predetermined parameter before and after each corona discharge; and then
   (d) comparing said standard and said comparison measurements of said predetermined parameter for predicting electrical failure in said semiconductor device after long-term operation.

2. A method of predicting electrical failures in semiconductor devices after long-term operation, said semiconductor device having a surface covered with an insulating material, said method comprising the steps of:
   (a) measuring a predetermined parameter of said semiconductor device for determining a standard measure of said predetermined parameter;

(b) exposing said insulating material to first a positive corona discharge and then to a negative corona discharge;

(c) measuring said predetermined parameter before and after each corona discharge for determining a comparison measure of said predetermined parameters; and then (d) comparing said standard and said comparison measures of said predetermined parameter for predicting electrical failure in said semiconductor device after long-term use.

* * * * *